US012654974B2

(12) United States Patent
Shih et al.

(10) Patent No.: US 12,654,974 B2
(45) Date of Patent: Jun. 16, 2026

(54) BONDING METHOD AND A BONDING APPARATUS FOR IMPLEMENTING THE BONDING METHOD

(71) Applicant: All Ring Tech Co., Ltd., Kaohsiung City (TW)

(72) Inventors: Chuen-Fa Shih, Kaohsiung City (TW); Chun-Hung Tsai, Kaohsiung City (TW); Yan-Zuo Chen, Kaohsiung City (TW)

( * ) Notice: Subject to any disclaimer, the term of this patent is extended or adjusted under 35 U.S.C. 154(b) by 64 days.

(21) Appl. No.: 18/676,602

(22) Filed: May 29, 2024

(65) Prior Publication Data

US 2024/0409354 A1 Dec. 12, 2024

(30) Foreign Application Priority Data

Jun. 6, 2023 (TW) ................................. 112120987

(51) Int. Cl.
B65H 37/02 (2006.01)
H05K 3/30 (2026.01)
H05K 3/303 (2026.01)

(52) U.S. Cl.
CPC .... B65H 37/02 (2013.01); B65H 2301/51122 (2013.01); B65H 2701/194 (2013.01); H05K 3/305 (2013.01); H05K 2203/0191 (2013.01)

(58) Field of Classification Search
CPC ........ H05K 3/305; H05K 3/321; H05K 3/323; B65H 37/02; B65H 2301/51122; B65H 2701/194
See application file for complete search history.

(56) References Cited

FOREIGN PATENT DOCUMENTS

| CN | 103190206 B | * | 12/2016 | ........... B23K 1/0016 |
| JP | H0553130 A | * | 3/1993 | ........... G02F 1/1345 |
| JP | H066019 A | * | 1/1994 | .............. H05K 3/32 |
| JP | 2015088606 A | * | 5/2015 | .......... H10P 72/0441 |
| JP | 6363606 B2 | * | 7/2018 | ......... H05K 13/0419 |

OTHER PUBLICATIONS

Japanese Office Action in related Japanese application No. 2024-082470, mailed May 13, 2025, with an English translation thereof.

* cited by examiner

*Primary Examiner* — Justin R Fischer
*Assistant Examiner* — Philip N Schwartz
(74) *Attorney, Agent, or Firm* — Thomas Horstemeyer, LLP

(57) ABSTRACT

A bonding method for using a bonding apparatus includes: transporting and reeling a carrier tape which is packaged with an adhering component, on a pressing assembly, and bending the carrier tape through a bending member to be divided into an input section and an output section; driving a roller to indirectly press and abut a front end of the adhering component to bring the adhering component into contact with a bonding start point a base component; and rolling the roller over the carrier tape to attach the adhering component to the bonding area while moving the bending member to indirectly scrape the adhering component from the carrier tape so as to firmly attach the adhering component to the base component without generation of air bubbles.

4 Claims, 10 Drawing Sheets

BONDING METHOD AND A BONDING APPARATUS FOR IMPLEMENTING THE BONDING METHOD

CROSS-REFERENCE TO RELATED APPLICATION

This application claims priority to Taiwanese Patent Application No. 112120987, filed on Jun. 6, 2023, and incorporated by reference herein in its entirety.

FIELD

The disclosure relates to a bonding method and a bonding apparatus for implementing the bonding method, and more particularly to a bonding method and a bonding apparatus for attaching an adhering component to a base component in an automatic manufacturing process.

BACKGROUND

A conventional bonding method and apparatus is disclosed in TW202238747. The conventional bonding method is for attaching an adhesive heatsink thermal pad to a base component in an automatic manufacturing process, and the conventional bonding apparatus is for implementing the conventional bonding method. In a conventional IC packaging process, adhesive is applied on a substrate, a die is attached to the substrate, a layer of thermal conductive glue is applied over the die, and then a heat sink is attached to cover the die and the substrate. Two cover films cover upper and lower surfaces of the heatsink thermal pad. One cover film is removed from the heatsink thermal pad by a bonding device, then the heatsink thermal pad is attached to the upper surface of the die, and the other cover film is peeled off. The bonding device has a deflection correcting mechanism with a four-linkage structure which is operable to deflect a driven member with horizontally extending slide rails disposed thereon, and a reel mechanism which has an upright seat slidably disposed on the slide rails for supporting reels, and an attaching member having an attaching tip portion. The carrier tape packaged with heatsink thermal pads is reeled and transported through the reel mechanism and the attaching member and is divided into an input section and an output section by the attaching member. With the horizontal movement of the upright seat along the slide rails toward the input section of the carrier tape, and the reeling of the carrier tape on the reel mechanism, while the heatsink thermal pad is removed from the carrier tape from one side, the attaching member is driven to attach the heatsink thermal pad to the base component toward the other side.

In another conventional bonding device and apparatus of heatsink thermal pads disclosed in TWM633357, an attaching head in the form of a round shaft is disposed at the feeding route of the carrier tape to divide the carrier tape into an input side and an output side. The attaching head is swingable about an axis of a reel axle to a working position to remove the heatsink thermal pad from the carrier tape and attach the removed pad to the base component.

Each of the attaching tip portion of the attaching member and the round shaft of the attaching head is served as a peeled point where the heatsink thermal pad is removed from the carrier tape and a start point where the removed pad is attached to the base component. With the variety of adhering conditions on the surface of the base component due to different functions of the product, such an attaching tip portion or a round shaft attaching head as described in the prior art is not suitable for performing a bonding operation to some base components. Therefore, it is required to develop the bonding methods and devices that can be used for a variety of base components.

SUMMARY

Therefore, an object of the disclosure is to provide a bonding method and a bonding apparatus that can alleviate at least one of the drawbacks of the prior art.

According to the disclosure, the bonding method for using a bonding apparatus including a bonding module, includes: transporting and reeling a carrier tape which is packaged with an adhering component, on a pressing assembly of a first pressing mechanism of the bonding module, and bending the carrier tape through a bending member of the pressing assembly to be divided into an input section and an output section by the bending member; driving a roller of the pressing assembly to indirectly press and abut a front end of the adhering component through the carrier tape to bring the adhering component into contact with a bonding start point of a bonding area of a base component; rolling the roller over the carrier tape to attach the adhering component to the bonding area of the base component from the bonding start point to a bonding finish point of the bonding area; and, during the step of rolling of the roller, moving the bending member together with the roller to bring the bending member to indirectly scrape the adhering component from the carrier tape through the carrier tape.

According to the disclosure, the bonding apparatus for implementing the bonding method includes a transporting device provided with a transporting route for base components, a transmitting mechanism disposed above the transporting device, and a bonding device connected with and moved by the transmitting mechanism. The bonding device is provided with the bonding module which has the first pressing mechanism.

With the roller of the pressing assembly indirectly pressing and abutting a front end of the adhering component through the carrier tape to bring the adhering component into contact with a bonding start point of a bonding area of a base component and then rolling over the carrier tape to attach the adhering component to the bonding area of the base component from the bonding start point to a bonding finish point of the bonding area, and with the bending member moved together with the roller during the step of rolling of the roller, to indirectly scrape the adhering component from the carrier tape through the carrier tape, the adhering component is flatly and firmly attached to the bonding area of the base component without generation of air bubbles.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 1:
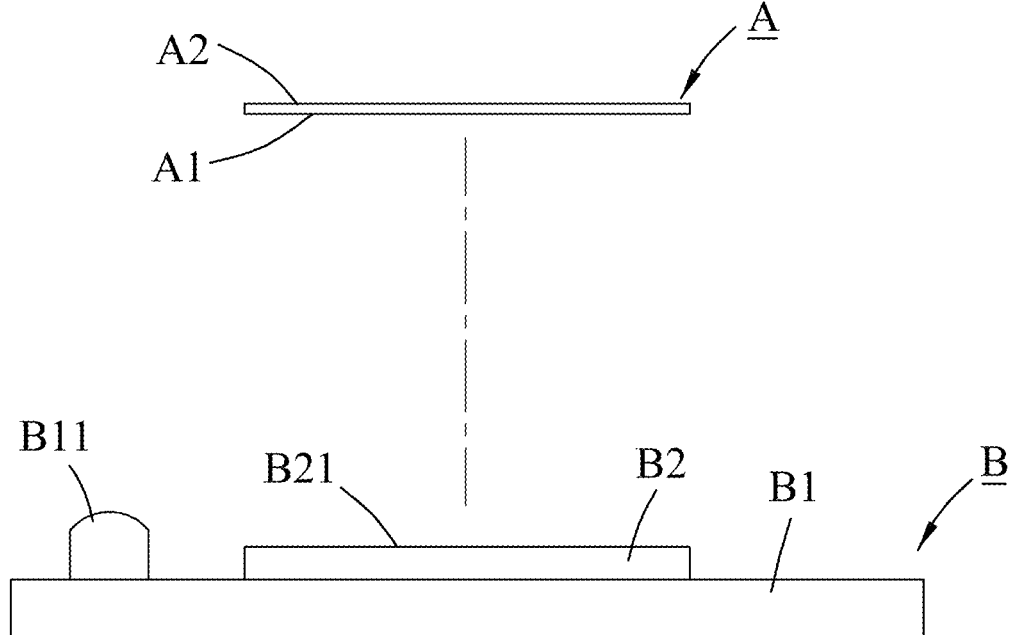
FIG. 1 is a schematic view of a base component and an adhering component.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, an embodiment of the bonding apparatus according to the disclosure is adapted to perform attachment of an adhering component (A) to a base component (B). The adhering component (A) may be a heatsink thermal pad of a rectangular sheet, and includes an adhesive portion (A1) on a lower surface, and a non-adhesive portion (A2) on an upper surface. The base component (B) may have a die (B2) on a rectangular substrate (B1). On the substrate (B1), electronic element (B11) such as passive components or circuit is disposed and protrudes from the substrate (B1). The die (B2) of the base component (B) has a bonding area (B21) on an upper surface thereof, and the electronic element (B11) may be higher than the bonding area (B21).

Figure 2:
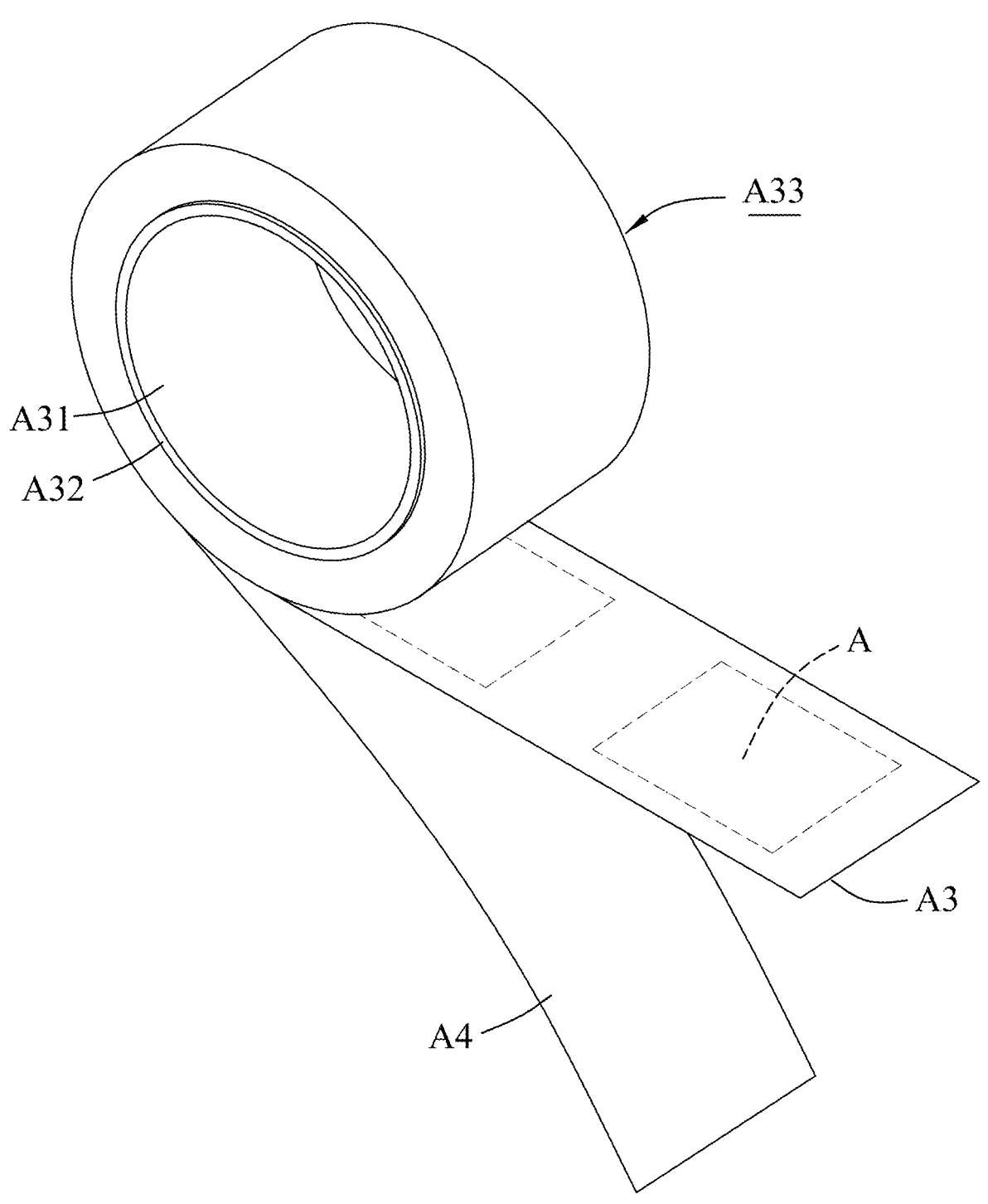
FIG. 2 is a perspective view of a tape assembly.

With reference to FIGS. 1 and 2, a plurality of the adhering components (A) are peelably attached and arranged to a carrier tape (A3) and are covered by a cover tape (A4). The carrier tape (A3) and the cover tape (A4) cooperatively enclose the adhering components (A), and the adhering components (A) are spaced apart from one another and arranged in the lengthwise direction of the carrier tape (A3). Each adhering component (A) has an adhesive lower surface (A1) peelably adhered on a non-adhesive inner layer of the cover tape (A4), and a non-adhesive upper surface (A2) peelably adhered on an adhesive inner layer of the carrier tape (A3). The carrier tape (A3) is reeled on a sleeve (A32) with an axial hole (A31) to form a tape assembly (A33).

Figure 3:
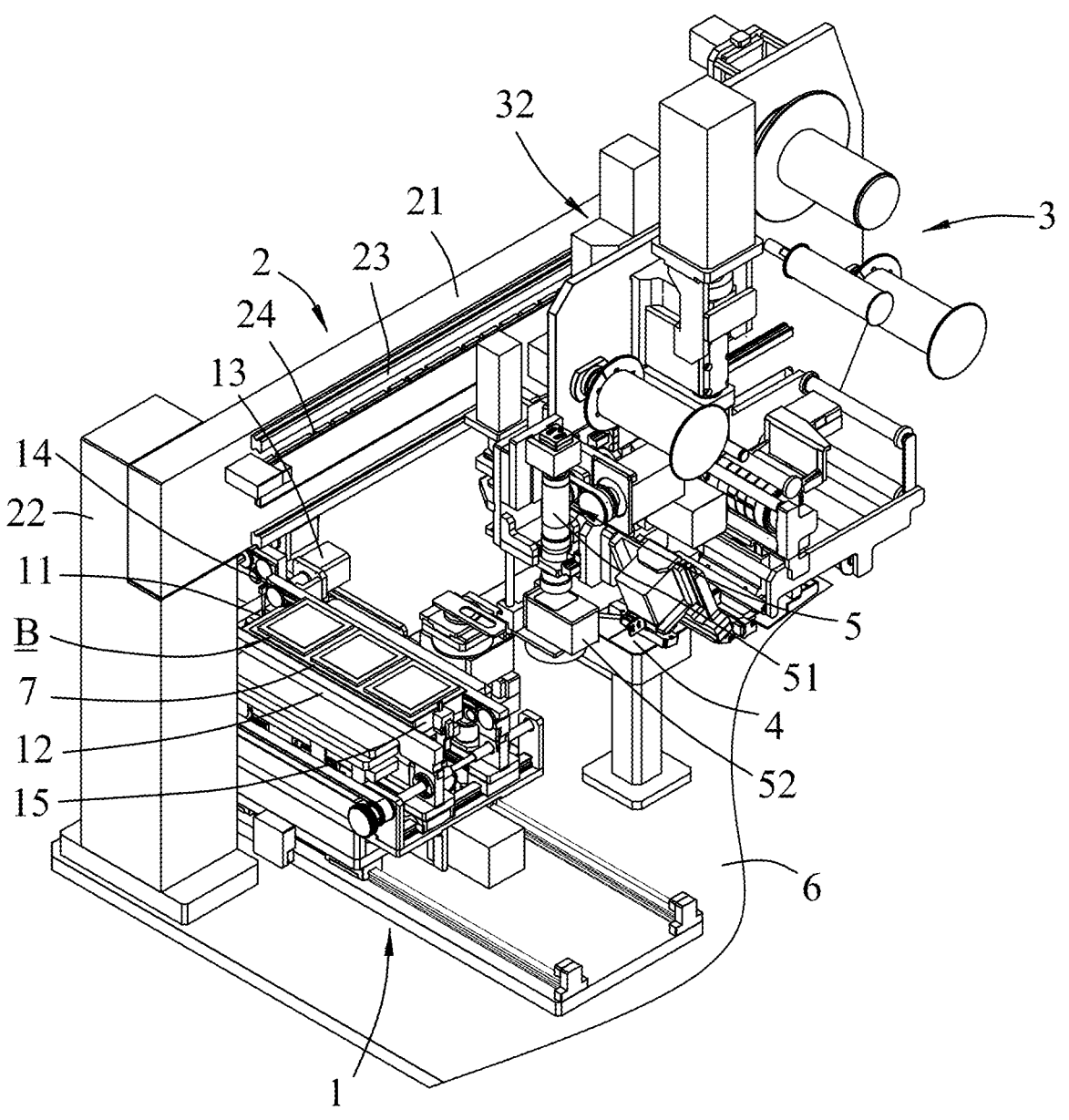
FIG. 3 is a fragmentary perspective view illustrating an embodiment of a bonding apparatus according to the disclosure.
Figure 4:
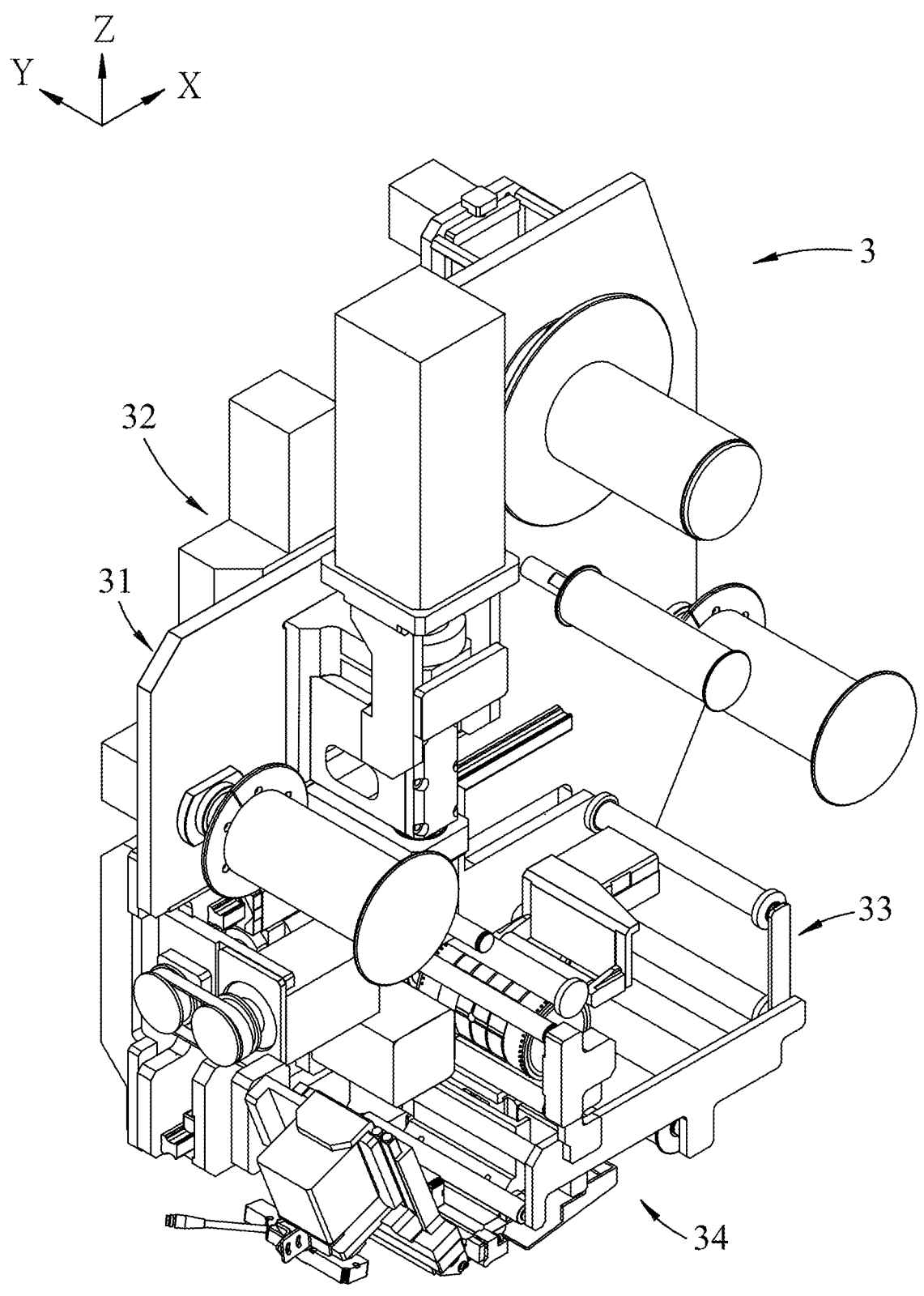
FIG. 4 is a perspective view illustrating a bonding device of the bonding apparatus.

With reference to FIG. 3, the bonding apparatus of the embodiment includes a transporting device 1, a transmitting mechanism 2, a bonding device 3, a load measuring device 4 and an alignment detecting unit 5 which are mounted on a machine base 6. The transporting device 1 has a feeding rail 11 to define a transporting route thereon for base components (B). The transmitting mechanism 2 has a beam 21 which is disposed above the transporting device 1 and which extends in an X-axis direction, two posts 22 which are disposed at two sides of the beam 21, a slide rail 23 and an X-axis driver 24, such as a linear motor, which are disposed on the beam 21. The bonding device 3 is disposed above the feeding rail 11 of the transporting device 1, and is slidably disposed on the slide rail 23 of the beam 21 of the transmitting mechanism 2 to be driven by the X-axis driver 24 to move relative to the transporting route along a predetermined route. The load measuring device 4 is disposed on the machine base 6, and is located at a side of the transporting device 1 and on the predetermined route where the bonding device 3 is moved toward the transporting device 1. The alignment detecting unit 5 is disposed at a side of the bonding device 3, and has a Z-axis detector 51, such as a CCD lens, which detects in a Z-axis direction, and a light source 52.

Specifically, the transporting device 1 has two lateral brackets 12 which extend in a Y-axis direction and which are spaced apart from each other, two belts 14 which are respectively disposed inboard of the lateral brackets 12 and which are driven by a driver 13 to form the feeding rail 11 therebetween, and a fixture 15 which is disposed at the transporting route defined by the feeding rail 11 and which is driven to move in the Z-axis direction. The base component (B) may be transported with a carrier 7 conveyed on the feeding rail 11, and stop at a position above the fixture 15 so as to be raised by the fixture 15.

With reference to FIGS. 2 to 6, the bonding device 3 has a first carrying module 31 for a tape assembly (A33) reeling a carrier tape (A3) and a cover tape (A4) to be disposed thereon, a driving module 32 which is disposed on the transmitting mechanism 2 to drive an up-down movement (a Z-axis movement) and a rotation of the first carrying module 31, a second carrying module 33 which is disposed on the first carrying module 31 and movable in the X-axis direction relative to the first carrying module 31, and a bonding module 34 which is disposed on the second carrying module 33 for the carrier tape (A3) to be disposed and dispensed and which is for attaching the adhering component (A) to the base component (B).

The first carrying module 31 includes a plate-like upright seat 311, a first transporting mechanism 312, a deflection correcting mechanism 313 and a driving mechanism 314 which are disposed on the same side surface of the upright seat 311. The first transporting mechanism 312 has a tape reel 3121 on which the tape assembly (A33) is disposed, a first reel 3122 for reeling the cover tape (A4), a second reel 3123 for reeling the carrier tape (A3), and a first guide reel 3124 for guiding the carrier tape (A3) toward the second carrying module 33. The deflection correcting mechanism 313 is interposed between the tape reel 3121 and the second reel 3123, and has an upper axle seat 3131, a lower axle seat 3132, and an upright pivot axle 3133 which extends in the Z-axis direction and which is pivotally connected between the upper and lower axle seats 3131, 3132. The driving mechanism 314 has two slide rails 3141 which are spaced apart from each other in the Z-axis direction and which extend parallel to each other in the X-axis direction, a threaded bolt 3142 which is interposed between the slide rails 3141, and an X-axis driver 3143 for driving rotation of the threaded bolt 3142. The upright seat 311 has a first opening 3134 which extends therethrough and which is formed between the upper and lower axle seats 3131, 3132, and a second opening 3144 which extends therethrough and which is formed between the slide rails 3141.

Figure 5:
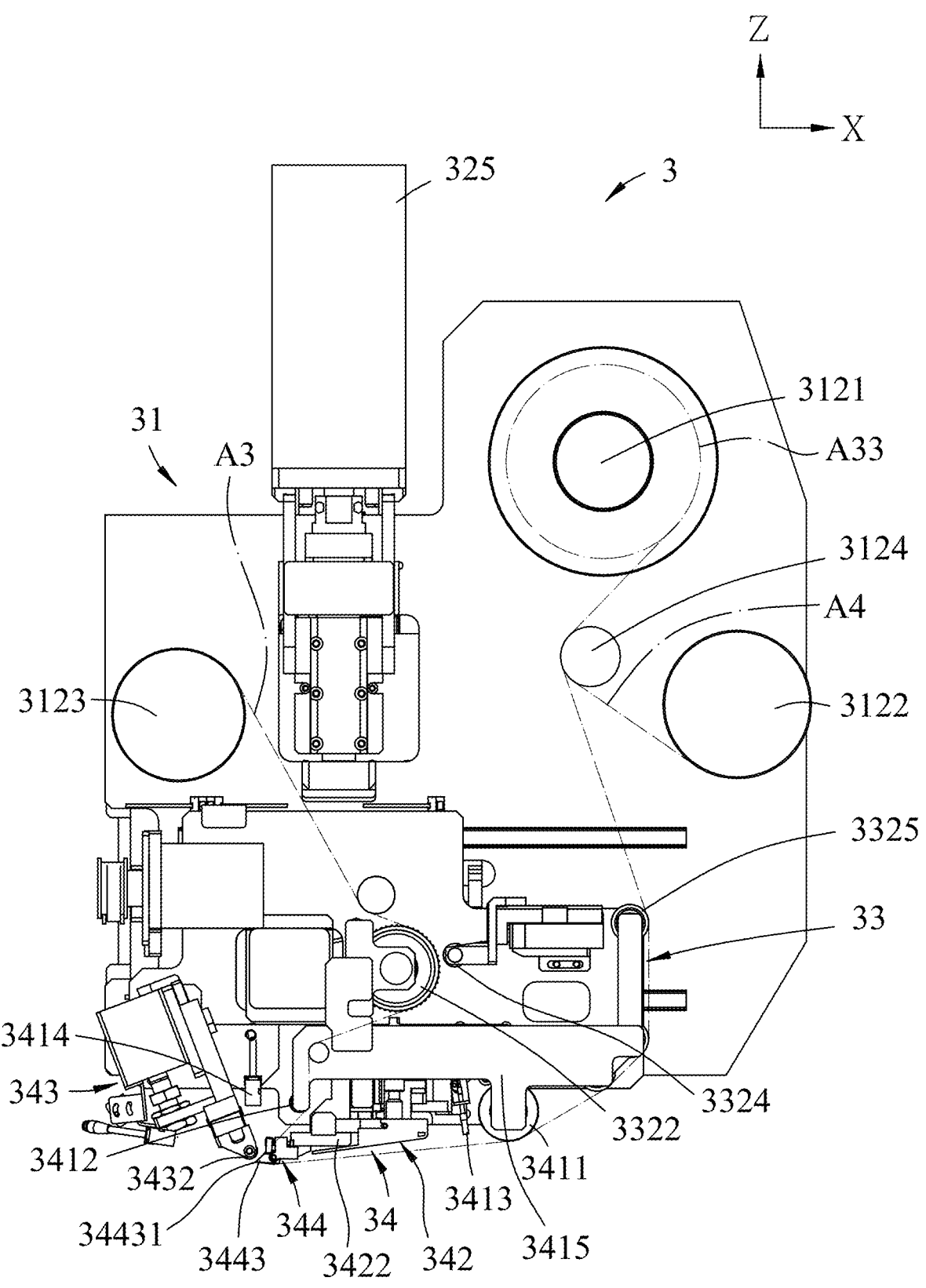
FIG. 5 is a front view illustrating the bonding device with a tape assembly mounted/installed thereon.
Figure 6:
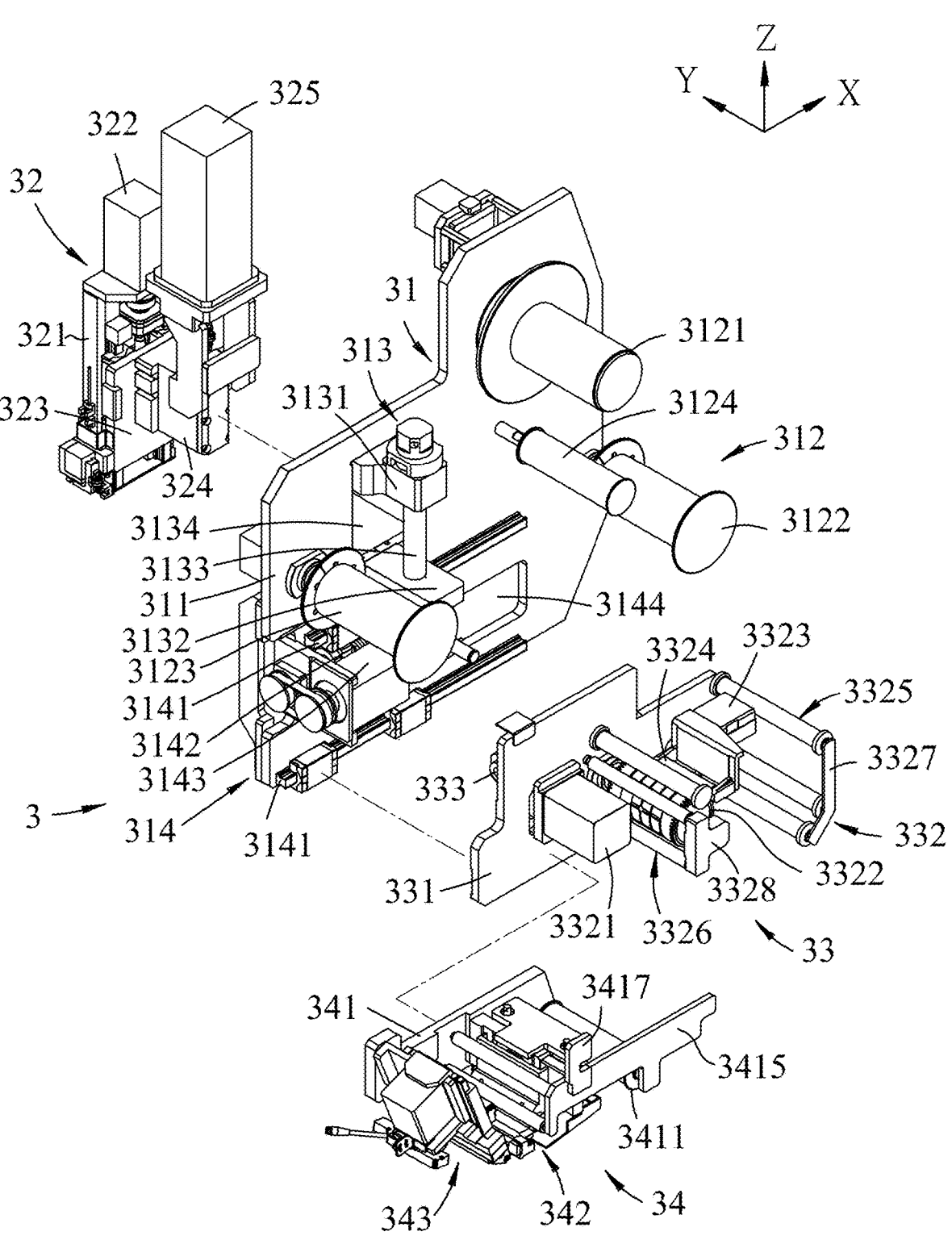
FIG. 6 is an exploded perspective view of the bonding device.

With reference to FIGS. 3, 5 and 6, the driving module 32 is disposed on the beam 21 of the transmitting mechanism 2, and is driven by the X-axis driver 24 to move on the slide rail 23 in the X-axis direction. The driving module 32 has an upright rail seat 321, a Z-axis sliding seat 323 which is located on the rail seat 321 and driven by a Z-axis driver 322 to move in the Z-axis direction, a projecting seat 324 which is disposed on the sliding seat 323, and a torque driver 325 such as a torque motor which is disposed on the projecting seat 324. Since the deflection correcting mechanism 313 is interposed between the tape reel 3121 and the second reel 3123, during the deflection of the upright seat 311, the deflections at the left and right sides of the upright seat 311 may be made substantially the same so as to keep the torque driver 325 in a balanced state. The upright rail seat 321 and the upright pivot axle 3133 of the first carrying module 31 are located at two opposite sides of the upright seat 311, respectively. The projecting seat 324 extends through the first opening 3134 such that the upright pivot axle 3133 is disposed in the projecting seat 324. The torque driver 325 is coupled with one end of the upright pivot axle 3133 to drive rotation of the upright pivot axle 3133 so as to deflect the upright seat 311 relative to the Z-axis sliding seat 323.

With reference to FIG. 6, the second carrying module 33 is slidably disposed on the two slide rails 3141 of the driving mechanism 314 of the first carrying module 31, and is driven by the X-axis driver 3143 to make a reciprocating horizontal movement in the X-axis direction relative to the first carrying module 31. The second carrying module 33 has an upright plate 331 and a second transporting mechanism 332 disposed on one side of the upright plate 331 for transporting the carrier tape (A3).

A threaded nut seat 333 is disposed on the other side of the upright plate 331 opposite to the second transporting mechanism 332 for the threaded bolt 3142 of the first carrying module 31 to be threadedly engaged therewith to drive movement of the second carrying module 33. The second transporting mechanism 332 has a pinwheel 3322 which is driven by a motor driver 3321 to transport the carrier tape (A3) along a tape reeling route, an abutting roller 3324 which is driven by a cylinder driver 3323 and which is disposed opposite to the pinwheel 3322 to abut against an opposite side of the carrier tape (A3), an input rolling pin assembly 3325 which is disposed at a side of the pinwheel 3322 and which includes a plurality of rolling shafts, an output rolling pin assembly 3326 which is disposed at an opposite side of the pinwheel 3322 and which includes a plurality of rolling shafts, a first coupling bracket 3327 which is disposed opposite to the upright plate 331 and on which the ends of the rolling shafts of the input rolling pin assembly 3325 are mounted, and a second coupling bracket 3328 which is disposed opposite to the upright plate 331 and on which the ends of the rolling shafts of the output rolling pin assembly 3326 and the pinwheel 3322 are mounted.

With reference to FIGS. 5 to 8, the bonding module 34 is disposed on the upright plate 331 to be moved with the upright plate 331 in the Z-axis direction and the X-axis direction. The bonding module 34 has a module seat 341, a first pressing mechanism 342 and a second pressing mechanism 343 which are disposed on the module seat 341. The carrier tape (A3) is transported to pass through the first pressing mechanism 342 to be divided into an input section (A34) and an output section (A35). Specifically, on the module seat 341, an input side guiding member 3411 at the input section (A34) side, an output side guiding member 3412 at the output section (A35) side, a detecting element 3413 near the tape reeling route of the input section (A34) of the carrier tape (A3), and a first ionizer 3414 near the tape reeling route of the output section (A35) of the carrier tape (A3) are disposed. The second pressing mechanism 343 is disposed on the module seat 341 at a side of the tape reeling route of the carrier tape (A3), and has a pressing member 3432 which is driven by a separate driver 3431, such as a sliding cylinder, to be movable in a tilted axis relative to the vertical direction and which is in the form of a roller, and a second ionizer 3433 which is disposed at a side of the pressing member 3432 opposite to the first pressing mechanism 342. Specifically, each of the input side guiding member 3411 and the output side guiding member 3412 is in the form of a round rod, and has one end disposed on the module seat 341, and the other end disposed on a first connecting piece 3415. The module seat 341 is spaced apart from the first connecting piece 3415 in the Y-axis direction. The first connecting piece 3415 is securely connected with the first coupling bracket 3327 and a positioning seat 3416 projecting from the module seat 341 in the Y-axis direction, and is securely connected with the second coupling bracket 3328 through a connecting piece 3417 so as to firmly support two sides of the carrier tape (A3) passing through the input side guiding member 3411 and the output side guiding member 3412 at the module seat 341 and the first connecting piece 3415 to keep the two sides in a horizontal state.

The first pressing mechanism 342 has a Z-axis driver 3421 such as a pneumatic cylinder, a movable stage 3422 driven by the Z-axis driver 3421 to move in the Z-axis direction, and a pressing assembly 344 disposed under and moved with the movable stage 3422. The Z-axis driver 3421 has an upper end securely disposed on a suspending piece 3418 which extends from the positioning seat 3416, and a lower end connected with and pressing the movable stage 3422. A piston rod 3423 is disposed between the suspending piece 3418 and the movable stage 3422 and is driven by the Z-axis driver 3421 to move the movable stage 3422 in the Z-axis direction. A guide hood 3424 is disposed below the movable stage 3422 and has an inclined guide surface 3425 which is spaced apart the carrier tape (A3) by a distance and conducts the reeling route of the carrier tape (A3).

Figure 9:
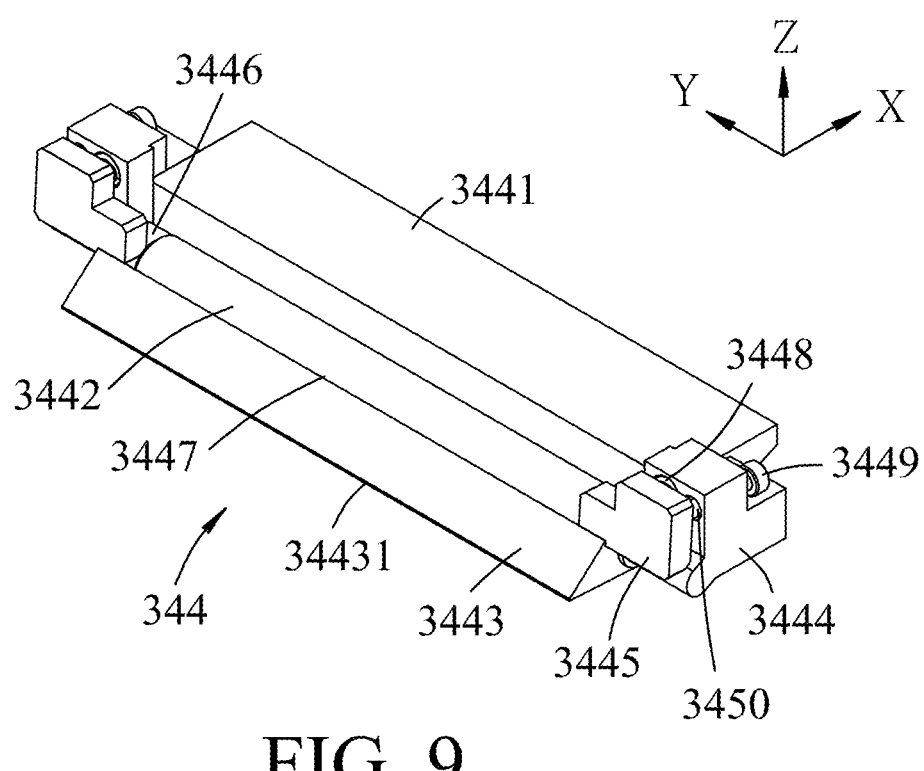
FIG. 9 is a perspective view illustrating a pressing assembly of the bonding module.
Figure 10:
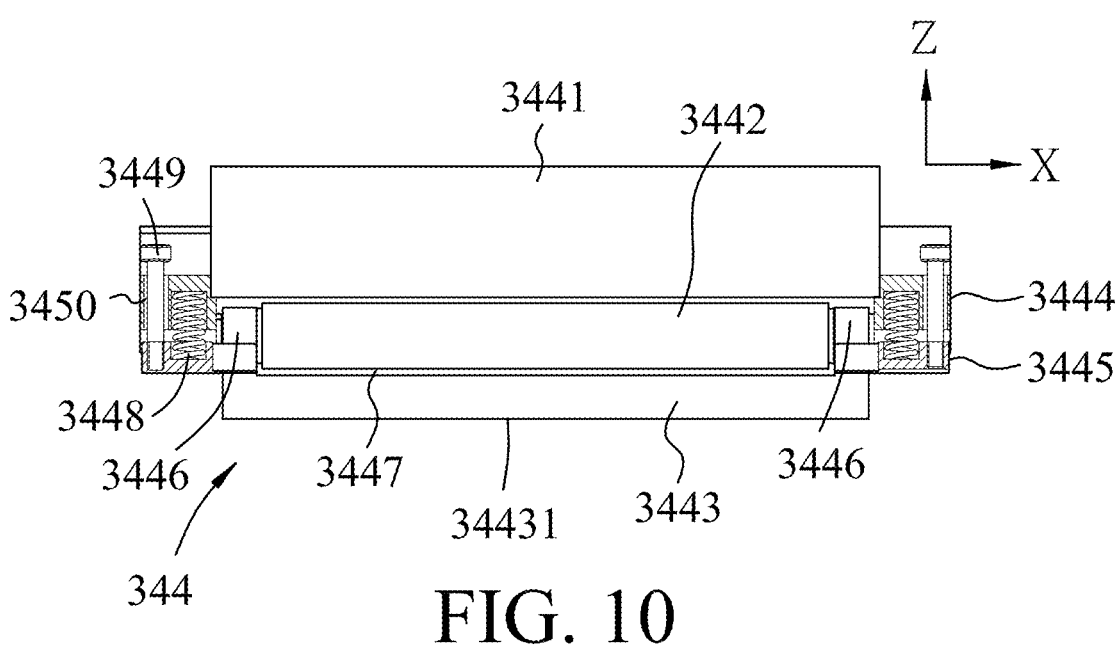
FIG. 10 is a partly-sectioned side view of the pressing assembly.

With reference to FIGS. 9 and 10, the pressing assembly 344 includes a mounting seat 3441 which is securely disposed on the movable stage 3422, a roller 3442 which has two ends pivotably mounted on the mounting seat 3441, and a bending member 3443 which has two ends pivotably mounted on the mounting seat 3441 and coaxial with the roller 3442 so as to be swingable relative to the mounting seat 3441. The mounting seat 3441 extends in the Y-axis direction to have two pivot portions 3444 at two opposite ends thereof on which the two ends of the roller 3442 is pivotably mounted. The bending member 3443 has two pivot arms 3446 which are aligned with the pivot portions 3444, respectively, to define a mounting space 3447 therebetween for receiving the roller 3442. Thus, the bending member 3443 and the roller 3442 are coaxial with each other and are pivotably mounted between the pivot portions 3444. The bending member 3443 further has a bending tip portion 34431 which is opposite to the pivot arms 3446 and which is tapered to have a corner angle less than 90 degrees. The pressing assembly 344 further includes two minor-adjusting members 3445 which are respectively and securely disposed on and moved with the two opposite ends of the bending member 3443, two biasing members 3448 (such as a coil spring) which are connected between the minor-adjusting members 3445 and the pivot portions 3444 to provide a torque to turn the bending member 3443 counterclockwise and downwards relative to the pivot portions 3444, and two threaded members 3449 (such as a threaded bolt) which are respectively extended through the through holes 3450 in the pivot portions 3444 and which are respectively and threadedly engaged with the minor-adjusting members 3445 to set the amount of angular displacement of the bending member 3443.

With reference to FIGS. 2 and 5, in operation, the tape assembly (A33) is reeled on the tape reel 3121, and with the operation of the pinwheel 3322, the carrier tape (A3) passes through the first guide reel 3124 and the cover tape (A4) is peeled from the carrier tape (A3) and is reeled on the first reel 3122. The carrier tape (A3) is fed, with the adhering component (A) facing downward, through the rolling shafts of the input rolling pin assembly 3325 and the input side guiding member 3411, is detected by the first detecting element 3413, passes through the pressing assembly 344 and the bending member 3443, is bent by the bending tip portion 34431 between the pressing assembly 344 and the pressing member 3432 of the second pressing mechanism 343 to extend upwardly, passes through the output side guiding member 3412 and the pinwheel 3322 with abutment by the abutting roller 3324, and is reeled on the second reel 3123. During the carrier tape (A3) feeding process, the first ionizer 3414 eliminates static on the carrier tape (A3). Through the first pressing mechanism 342, the carrier tape (A3) is divided by the bending member 3443 into the input section (A34) toward the input side guiding member 3411, and the output section (A35) toward the output side guiding member 3412.

With reference to FIG. 3, through the X-axis movement of the bonding device 3 along the slide rail 23 of the beam 21 of the transmitting mechanism 2 and through the Z-axis movement of the driving module 32, the bonding module 34 of the bonding device 3 is rapidly moved for the load measuring device 4 to measure the loading and force thereof, and aligned with the transporting device 1. The Z-axis detector 51 of the alignment detecting unit 5 detects alignment of the bonding module 34 with the transporting route for performing a bonding operation.

Figures 7, 8:
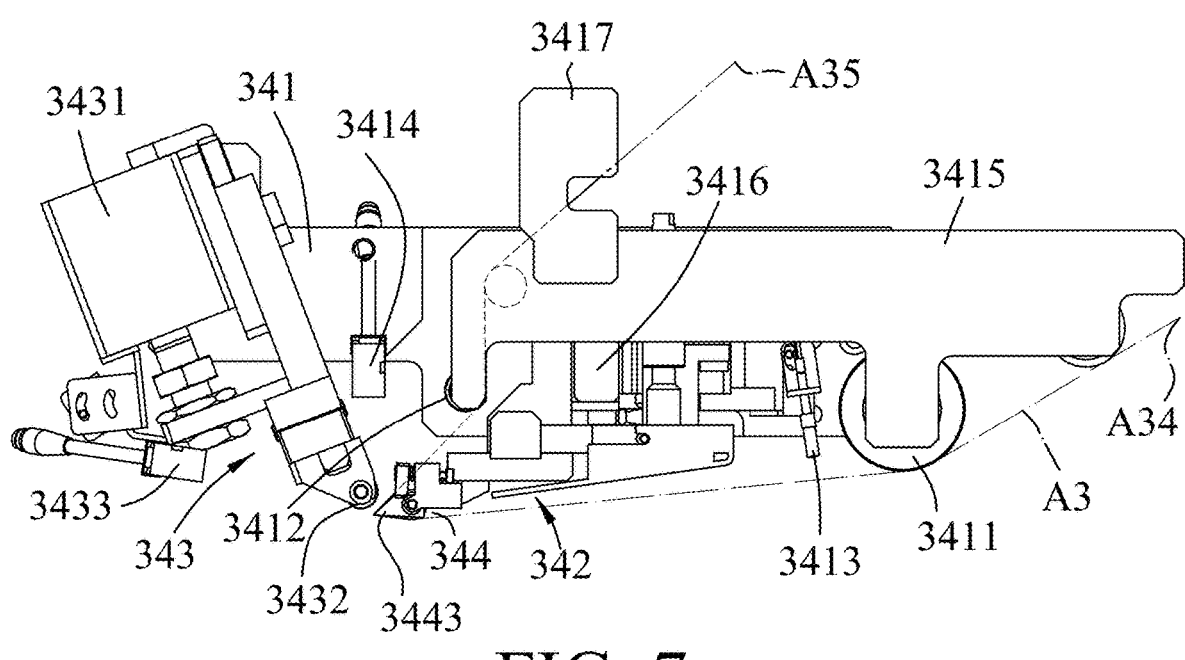
FIG. 7 is a front view illustrating a bonding module of the bonding device.
FIG. 8 is a front view similar to FIG. 7, a first connecting piece and a second connecting piece being removed for sake of clarity.
Figure 11:
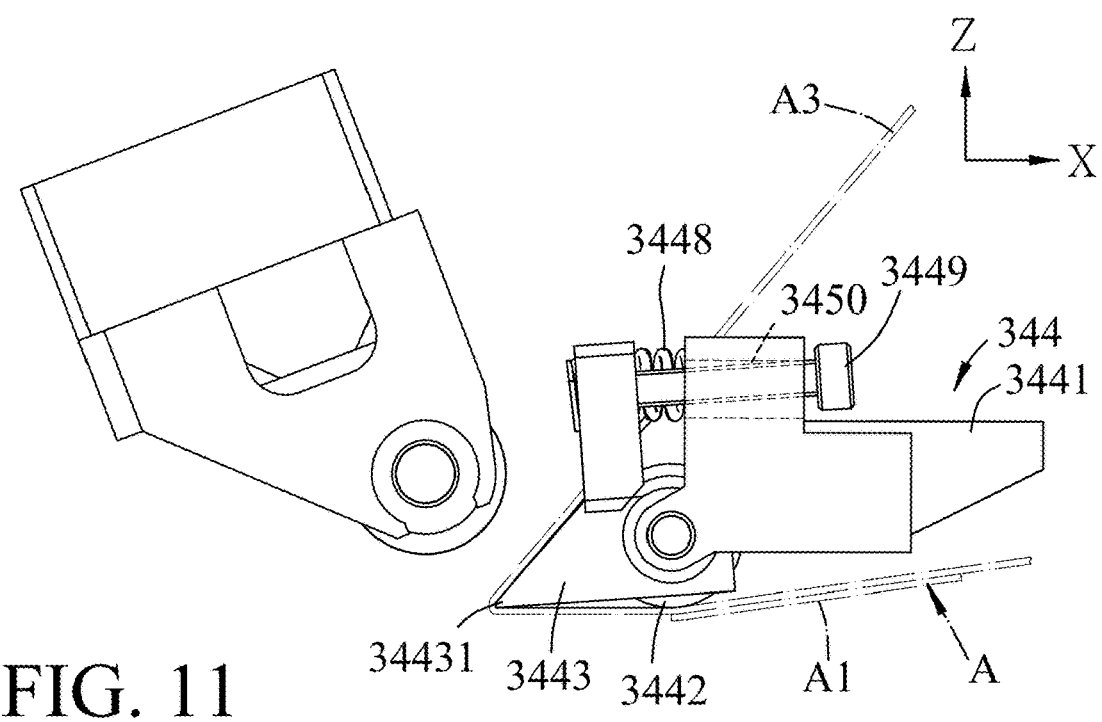
FIGS. 11 to 14 are schematic views of the pressing assembly, illustrating the bonding operation of the bonding apparatus.

With reference to FIGS. 7 and 11, the carrier tape (A3) is transported intermittently during the transporting operation and is moved by a distance corresponding to one adhering component (A) in each displacement. Specifically, the first detecting element 3413 detects the position of the adhering component (A) when the carrier tape (A3), with the adhering component (A) facing downward, passes through the first detecting element 3413 such that, in the next displacement, the next adhering component (A) is moved with the carrier tape (A3) to have the front end of the adhering component (A) aligned with the roller 3442 of the pressing assembly 344 while the bending member 3443 is biased by the action of the biasing members 3448 to have the bending tip portion 34431 inclined downwardly with the engagement of the threaded members 3449 with the through holes 3450.

Figure 12:
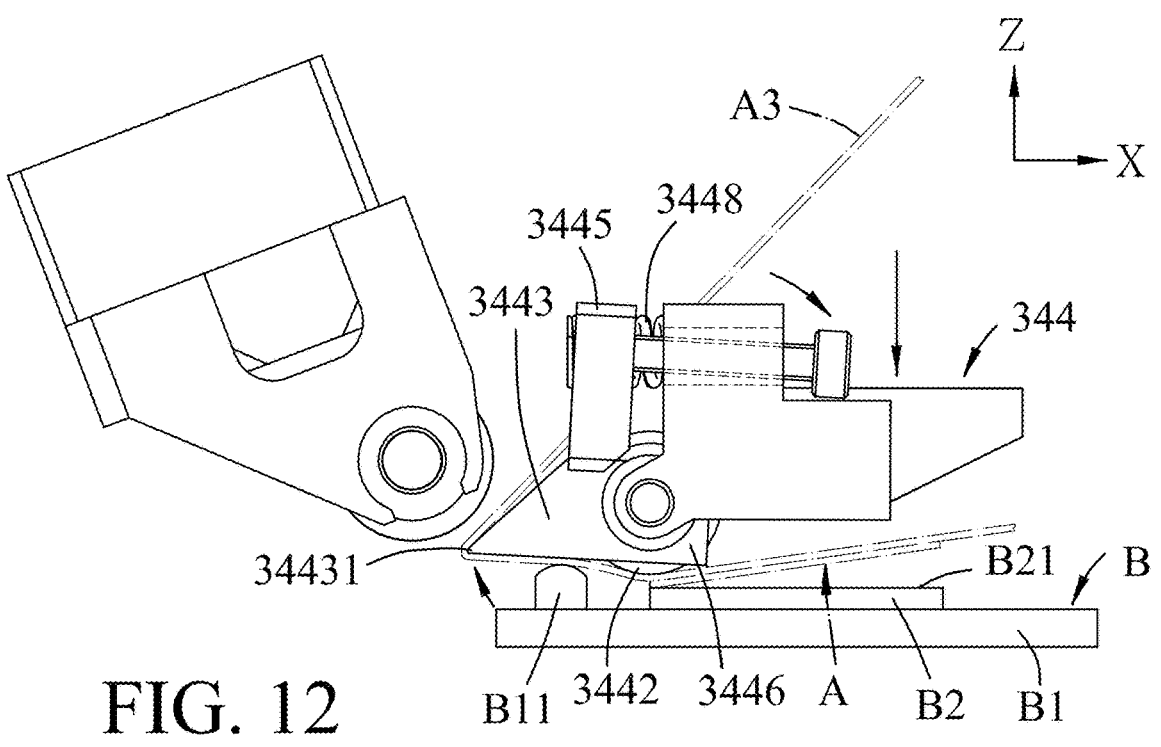

With reference to FIGS. 7 and 12, in this embodiment, the base component (B) may be in the form of a die (B2) on a rectangular substrate (B1). On the substrate (B1), an electronic element (B11) such as passive components or circuit is disposed adjacent to the die (B2) and protrudes higher than the bonding area (B21) of the die (B2). In operation of the bonding module 34, the Z-axis driver 3421 (see FIG. 8) is operated to move the movable stage 3422 and the roller 3442 of the pressing assembly 344 downwardly to bring the roller 3442 to indirectly press and abut the front end of the adhering component (A) through the carrier tape (A3) so as to bring the adhering component (A) into contact with a bonding start point of the bonding area (B21) of the base component (B). Meanwhile, the bending tip portion 34431 is turned clockwise, when subjected to the protruding electronic element (B11), about the rotating axis defined by the two pivot arms 3446, and the biasing members 3448 is compressed by the minor-adjusting members 3445 to allow the bending tip portion 34431 to turn upwardly so as to avoid the electronic element (B11) and permit the electronic element (B11) to be under the bending tip portion 34431 and spaced apart by the carrier tape (A3) so as to not interfere with the rolling and pressing of the roller 3442 when attaching the adhering component (A) to the base component (B).

Figure 13:
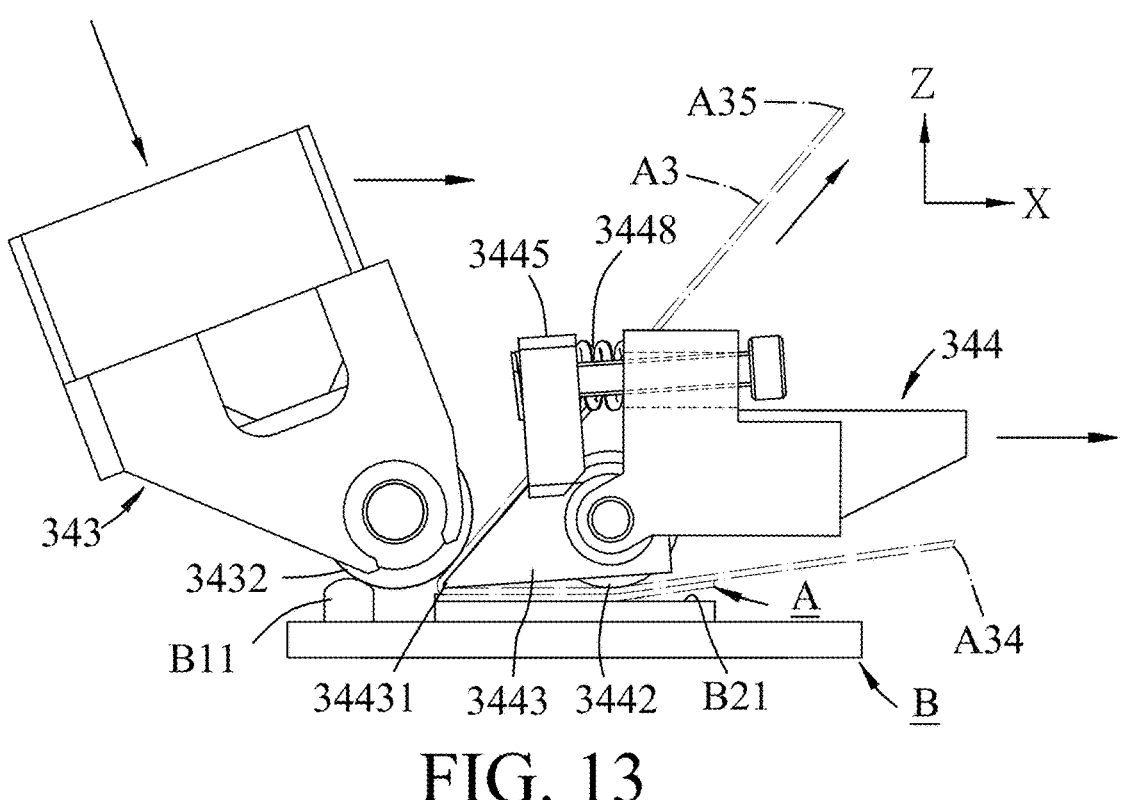

With reference to FIGS. 7 and 13, after the front end edge of the adhering component (A) contacts and is attached to the bonding start point of the bonding area (B21) of the base component (B), the bonding module 34 is driven by the X-axis driver 3143 to move horizontally in the X-axis direction toward the input section (A34) of the carrier tape (A3) such that the roller 3442 of the pressing assembly 344 rolls over the carrier tape (A3) to indirectly press and attach the adhering component (A) to the bonding area (B21) of the base component (B) until the rear end edge of the adhering component (A) contacts and is attached to the rear end side of the bonding area (B21) of the base component (B). As such, air bubbles are push out during the bonding operation of the adhering component (A). During the rolling of the roller 3442, the carrier tape (A3) is continuously being transported and bent through the bending tip portion 34431 toward the output section (A35), and the bending member 3443 is moved together with the roller 3442 in the X-axis direction over the electronic element (B11) and is then turned counterclockwise by the biasing action of the biasing members 3448 to have the bending tip portion 34431 inclined downwardly and indirectly contact and press the bonding start point of the front end side of the bonding area (B21). Along with the rolling of the roller 3442, the bending tip portion 34431 is brought to indirectly scrape the adhering component (A) from the carrier tape (A3) through the carrier tape (A3) until the bending tip portion 34431 reaches the bonding finish point of the rear end side of the bonding area (B21) of the base component (B) so as to facilitate flat and firm attachment of the adhering component (A) to the bonding area (B21) of the base component (B). During the rolling of the roller 3442, the pressing member 3432 of the second pressing mechanism 343 is moved with the roller 3442 in the X-axis direction. While the bending tip portion 34431 scrapes the adhering component (A), the pressing member 3432 is driven to move along a tilt axis toward the bending tip portion 34431 and is then moved over the electronic element (B11) to reach the bonding tip point of the bonding area (B21) of the base component (B).

Figure 14:
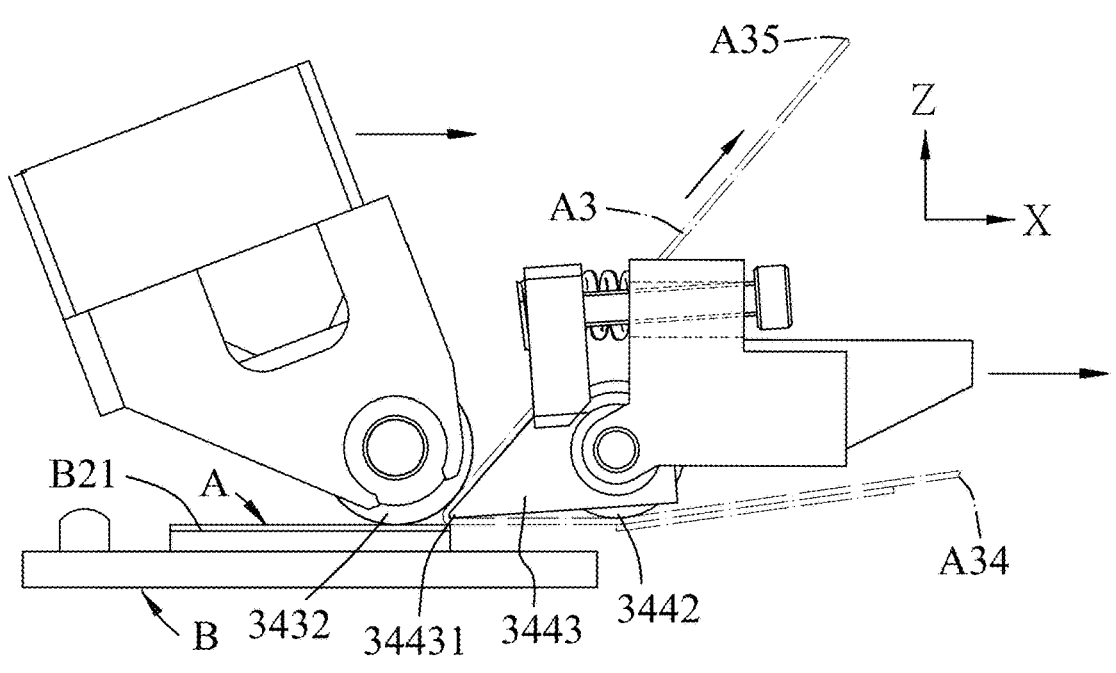

With reference to FIGS. 7 and 14, when the bending tip portion 34431 of the bending member 3443 is pressed to indirectly contact the bonding start point of the bonding area (B21) of the base component (B), part of the adhering component (A) has been attached to the base component (B) with a predetermined length which is set as an axial distance between a central axis of the roller 3442 and the bending tip portion 34431. Also, with the horizontal movement of the bending tip portion 34431 in the X-axis direction toward the input section (A34) of the carrier tape (A3), the carrier tape (A3) is bent through the bending tip portion 34431 and is transported toward the output section (A35) so as to be peeled from the adhering component (A) attached to the bonding area (B21) of the base component (B). During the X-axis movement of the pressing member 3432 along with the roller 3442 and the bending tip portion 34431 of the bending member 3443, the pressing member 3432 directly rolls over the upper surface of the adhering component (A) and presses the adhering component (A) onto the base component (B) until the pressing member 3432 reaches the bonding finish point of the bonding area (B21) of the base component (B) so as to bring the adhering component (A) into firm attachment to the bonding area (B21) of the base component (B).

In a modified embodiment, with the roller 3442 and the bending member 3443 of the first pressing mechanism 342 used to perform the bonding operation, the adhering component (A) is firmly attached to the bonding area (B21) of the base component (B) without generation of air bubbles. Hence, the pressing member 3432 of the second pressing mechanism 343 may be dispensed with. The pressing member 3432 can attach the adhering component (A) to the bonding area (B21) of the base component (B) more steadily and firmly. Moreover, the bending tip portion 34431 may be moved horizontally during the scrapping operation. Also, the bending member 3443 may be disposed securely on the mounting seat 3441 when performing a bonding method of a base component (B) on which no electronic element is disposed higher than the bonding area of the base component. Furthermore, depending on the bonding operation of a variety of the carrier tapes, such as a carrier tape with one single adhesive surface, the carrier tape (A3) packaged with adhering components (A) may be selectively reeled on and bent through one of the roller 3442, the bending tip portion 34431 of the bending member 3443 and the pressing member 3432, which might generate different bonding methods and effects.

As illustrated, with the roller 3442 of the pressing assembly 344 indirectly pressing and abutting a front end of the adhering component (A) through the carrier tape (A3) to bring the adhering component (A) into contact with a bonding start point of a bonding area (B21) of a base component (B) and then rolling over the carrier tape (A3) to attach the adhering component (A) to the bonding area (B21) of the base component (B) from the bonding start point to a bonding finish point of the bonding area (B21), and with the bending member 3443 moved together with the roller 3442 during the step of rolling of the roller 3442, to indirectly scrape the adhering component (A) from the carrier tape (A3) through the carrier tape (A3), the adhering component (A) is flatly and firmly attached to the bonding area (B21) of the base component (B) without generation of air bubbles.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A bonding method for using a bonding apparatus including a bonding module, comprising:

transporting and reeling a carrier tape packaged with an adhering component on a pressing assembly of a first pressing mechanism of the bonding module, and bending the carrier tape through a bending member of the pressing assembly to be divided into an input section and an output section by the bending member;

driving a roller of the pressing assembly to indirectly press and abut a front end of the adhering component through the carrier tape to bring the adhering component into contact with a bonding start point of a bonding area of a base component;

rolling the roller over the carrier tape to attach the adhering component to the bonding area of the base component from the bonding start point to a bonding finish point of the bonding area; and during the step of rolling of the roller, moving the bending member together with the roller to bring the bending member to indirectly scrape the adhering component from the carrier tape through the carrier tape.

2. The bonding method of claim 1, wherein, when a bending tip portion of the bending member is pressed to indirectly contact the bonding start point of the bonding area of the base component, part of the adhering component has been attached to the base component with a predetermined length which is set as an axial distance between a central axis of the roller and the bending tip portion.

3. The bonding method of claim 1, wherein a portion of the carrier tape is being peeled from the adhering component which has been attached to the bonding area of the base component when the portion of the carrier tape is transported and bent through a bending tip portion of the bending member to be formed as the output section.

4. The bonding method of claim 1, further comprising: during the step of rolling of the roller and along with the movement of the roller and the bending member, driving a pressing member of a second pressing mechanism of the bonding module to directly press and roll an upper surface of the adhering component to bring the adhering component into firm attachment to the bonding area of the base component.

\* \* \* \* \*